United States Patent [19]
Kulik et al.

[11] Patent Number: 6,107,998
[45] Date of Patent: *Aug. 22, 2000

[54] PHOTOVOLTAIC MODULE WITH DISPLAY INDICATOR

[76] Inventors: David Kulik, 152 Griffin Dr., Hurley, N.Y. 12443; Martin Charles, P.O. Box 369, Ellenville, N.Y. 12428; Morton Schiff, P.O. Box 1517, Olive Bridge, N.Y. 12461

[*] Notice: This patent is subject to a terminal disclaimer.

[21] Appl. No.: 09/018,817

[22] Filed: Feb. 4, 1998

Related U.S. Application Data

[63] Continuation-in-part of application No. 08/660,493, Jun. 7, 1996, Pat. No. 5,717,478.

[51] Int. Cl.⁷ ..................................................... G09G 5/00
[52] U.S. Cl. ........................... 345/211; 345/52; 349/199
[58] Field of Search ................................. 345/87, 33, 34, 345/38, 50, 52, 211, 214; 126/600, 608, 561, 569, 634, 682; 250/203; 349/199; 40/610; 177/210 R

[56] References Cited

U.S. PATENT DOCUMENTS

| | | | |
|---|---|---|---|
| 4,269,173 | 5/1981 | Krueger et al. | 126/634 |
| 4,316,448 | 2/1982 | Dodge | 126/600 |
| 4,551,669 | 11/1985 | Itoh et al. | 323/268 |
| 4,754,271 | 6/1988 | Edwards | 345/87 |
| 4,856,605 | 8/1989 | Cornelius | 177/210 R |
| 4,868,379 | 9/1989 | West | 250/203 |
| 5,195,504 | 3/1993 | Lane | 126/682 |
| 5,542,203 | 8/1996 | Luoma et al. | 40/610 |
| 5,717,478 | 2/1998 | Kulik et al. | 349/199 |

*Primary Examiner*—Xiao Wu
*Attorney, Agent, or Firm*—Charles J. Brown

[57] ABSTRACT

A photovoltaic module capable of being oriented by hand with respect to the sun, including an infinitely adjustable stand system for locating the module at its optimum orientation with respect to the sun and a multi-volt controller for regulating the power flow between the module and one or more powered devices.

8 Claims, 5 Drawing Sheets

PHOTOVOLTAIC MODULE WITH DISPLAY INDICATOR

CROSS REFERENCE TO RELATED APPLICATION

This application is a continuation-in-part of my co-pending application entitled PHOTOVOLTAIC MODULE WITH LIQUID CRYSTAL DISPLAY INDICATOR, filed Jun. 7, 1996 and assigned Ser. No. 08/660,493, U.S. Pat. No. 5,717,478.

BACKGROUND OF THE INVENTION

Power generating photovoltaic modules are often used with portable electrical equipment. For example, it has been proposed to mount such modules on the exterior of a case containing batteries and an electrically activated device such as a lap top computer. The case itself is oriented by hand with respect to an energizing light source, usually the sun, so that the module can generate electricity to charge the batteries from which the computer is powered.

There is always an optimum orientation of the module with respect to the light source which yields the maximum power output from the module. That optimum orientation is usually when the incident light falls generally perpendicular to the photovoltaic cells of the module, though that may vary depending upon the effect of random reflected light supplementing the direct sunlight.

U.S. Pat. No. 4,551,669 describes photovoltaic modules mounted on a mobile object such as an automobile which as it changes location experiences variations in energizing light and power output. A regulating system is provided which is powered from the cells of the module and which automatically switches the cells between series and parallel connections in response to a signal from a light intensity detector. In doing so the power output of the cells at a given instantaneous position of the automobile on which the module is mounted can be increased depending upon whether a series or a parallel configuration yields a greater output.

The particular purpose of the present invention is twofold. One is to provide a stand system for the module permitting it to be located at the optimum orientation with respect to incident light, as mentioned previously. The other purpose is to provide a multi-volt controller for regulation of electrical energy flow between the photovoltaic module and the electric equipment powered thereby.

SUMMARY OF THE INVENTION

The improvements of the invention are to be in combination with a substantially flat photovoltaic module having photovoltaic cells on one face thereof. In such a module an electrically activated display assembly is included which indicates its power generating effectiveness for its instantaneous orientation with respect to an energizing light source.

In one improvement of the invention a stand system is provided for locating the module at its optimum orientation with respect to the light source. This stand system comprises a straight mounting edge on the module for disposition on a support surface. At least one infinitely adjustable hinge element is included on that face of the module opposite that module face on which the photovoltaic cells are located. A support member is pivotally attached to the module by the hinge element and includes an extended support arm remote from the hinge unit disposed parallel to the mounting edge of the module. This hinge element permits infinite adjustment of the angle between the module face on which the photovoltaic cells are located and the support surface so that that module face may be oriented substantially perpendicular to light rays from the energizing light source.

In a preferred form of this embodiment of the invention two hinge elements are included in the stand system, preferably of the same form except that each is a mirror image of the other. The support member may include two parallel side sections extending from the respective hinge elements to respective opposite ends of the support arm. These parallel side sections and the support arm of the support member are all continuous and of the same circular cross section.

In another improvement of the invention a multi-volt controller is electrically connected between the photovoltaic module and a load powered by the module. At least one voltage regulator is included for maintaining the photovoltaic module output voltage at some predetermined level consistent with the load. A maximum power tracker is included for monitoring the voltage output of the module and to disconnect the voltage regulator from the load when the module voltage output drops below a certain minimum, and to reconnect the voltage regulator to that load when the module voltage output rises above a certain maximum which is higher than the minimum. It is to be understood that the maximum power tracker is inoperative and has no effect if the load can be powered by the module.

Two voltage regulators are included in a preferred form of this system, one for maintaining the first voltage regulator output at a fixed voltage to power a computer and the other for maintaining the second voltage regulator output at a selected voltage to power apparatus requiring that particular voltage.

DESCRIPTION OF PREFERRED EMBODIMENT

Figure 1:
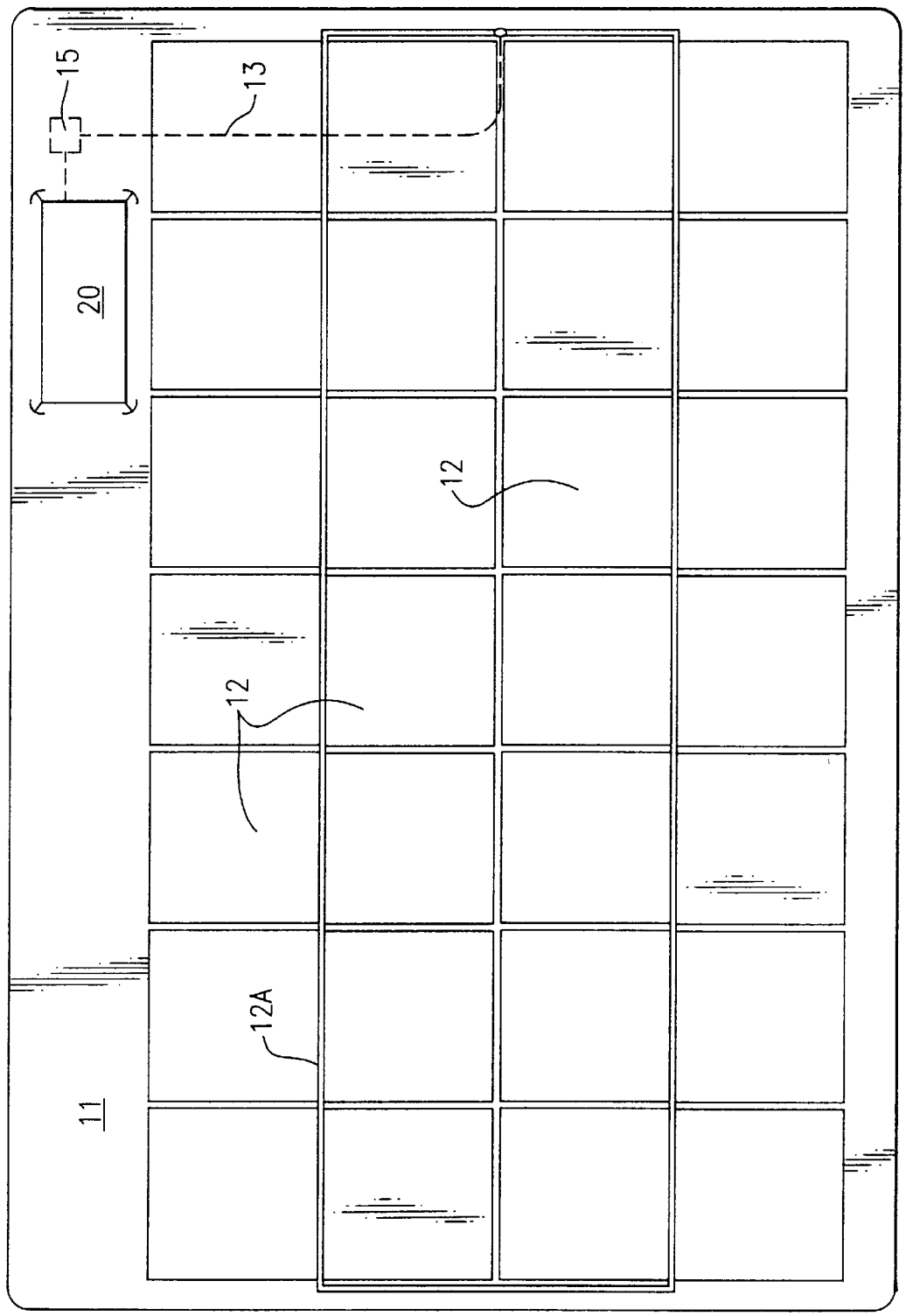
FIG. 1 is a plan view of a photovoltaic module according to the invention.

Referring first to FIG. 1, a photovoltaic module generally indicated as 10 includes a planar body 11 on which is mounted an array of primary photovoltaic cells 12 for generating relatively high power output for a load.

In this example of the module 10, the body 11 is a sheet of black acrylonitrile butyl styrene (ABS) of rectangular shape, perhaps about 10"×15". There are fourteen cells 12 shown mounted on the body 11 in this embodiment, all interconnected in a conventional manner by appropriate bus bar conductors 12A. The power output of the cells 12 of the module 10 is carried by a conductor 13 to a connector 15.

Figure 2:
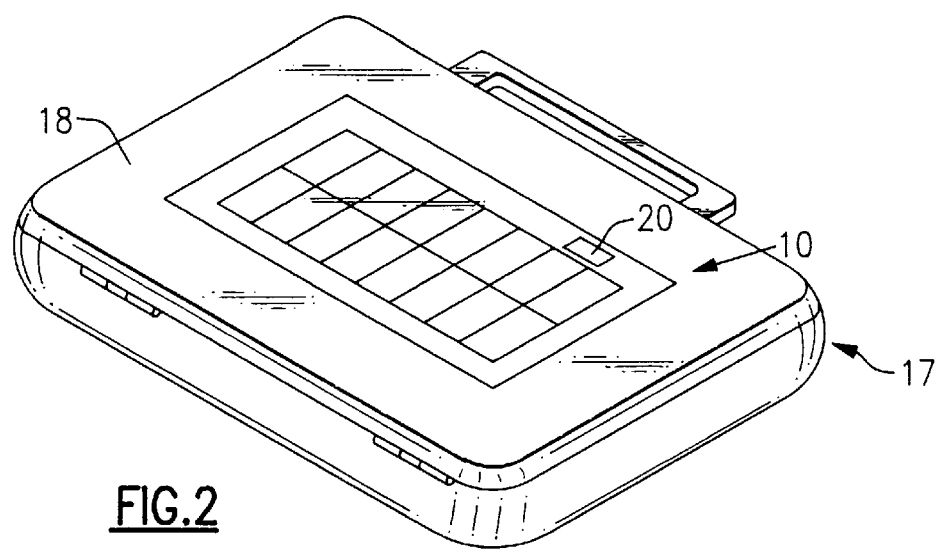
FIG. 2 is an illustration of the module of the invention in combination with a case adapted to contain a load-creating device such as a computer.

As shown in FIG. 2, the module 10 may be mounted, for example, on a case 17 and fixed to one exterior surface of the case such as its lid 18, and the load could be batteries and a lap top computer contained within the case. That load may be connected to the module 10 at the connector 15.

Figure 3:
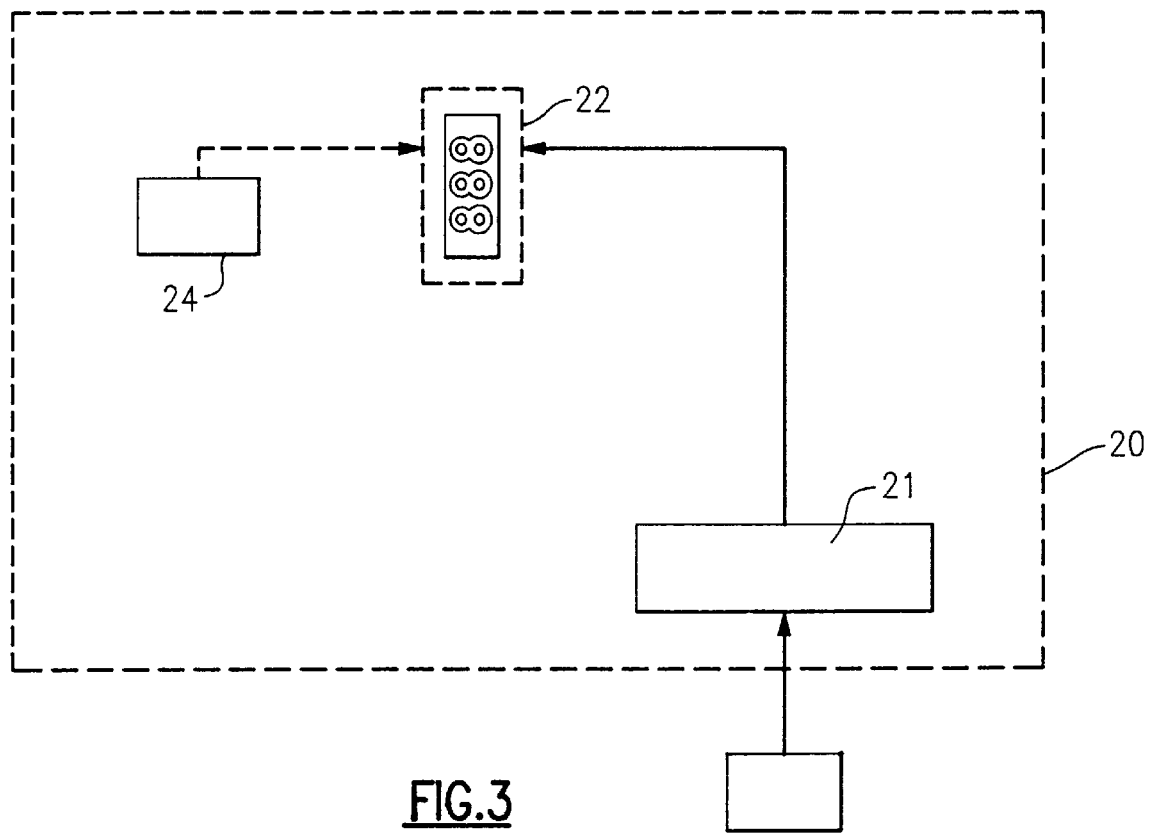
FIG. 3 is a diagrammatic illustration of the components of the liquid crystal display device included in the module.

Referring now to FIG. 3 the module 10 supplies a relatively low power output to a display assembly generally indicated within dotted lines 20. The display assembly 20 also appears in FIG. 1 in an appropriate aperture in the module body 11. The assembly 20 includes a linear voltage regulator 21 and a liquid crystal display device 22. In addition the assembly 20 includes its own small secondary photovoltaic cell or sun sensor 24. As described hereinafter the sun sensor 24 is preferably a dedicated cell serving only to signal the liquid crystal display device 22 as to the power output effectiveness of the module 10 for its instantaneous orientation with respect to the energizing light source such as the sun.

Figure 4:
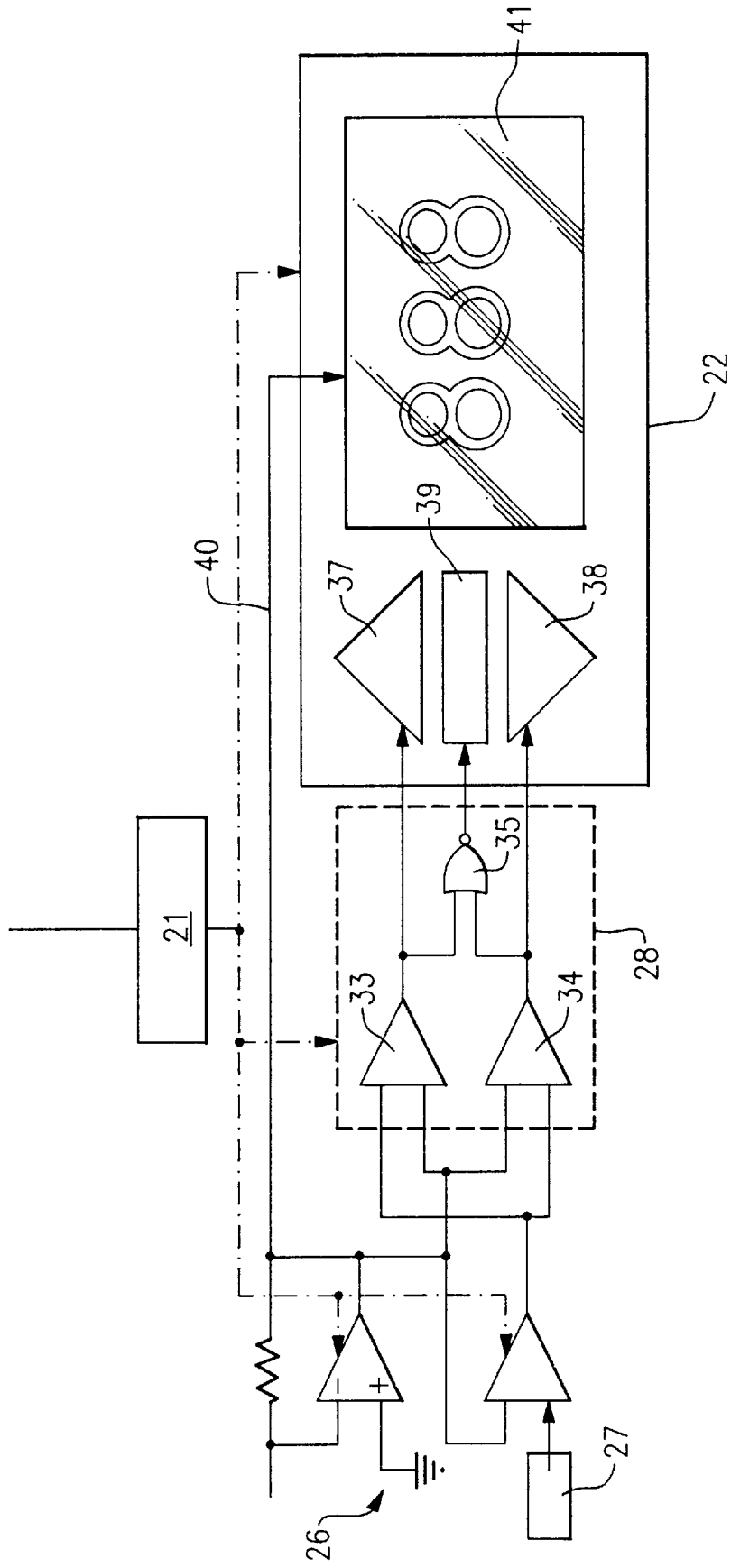
FIG. 4 is a circuit diagram of the liquid crystal display device and those components directly associated therewith.
Figure 5:
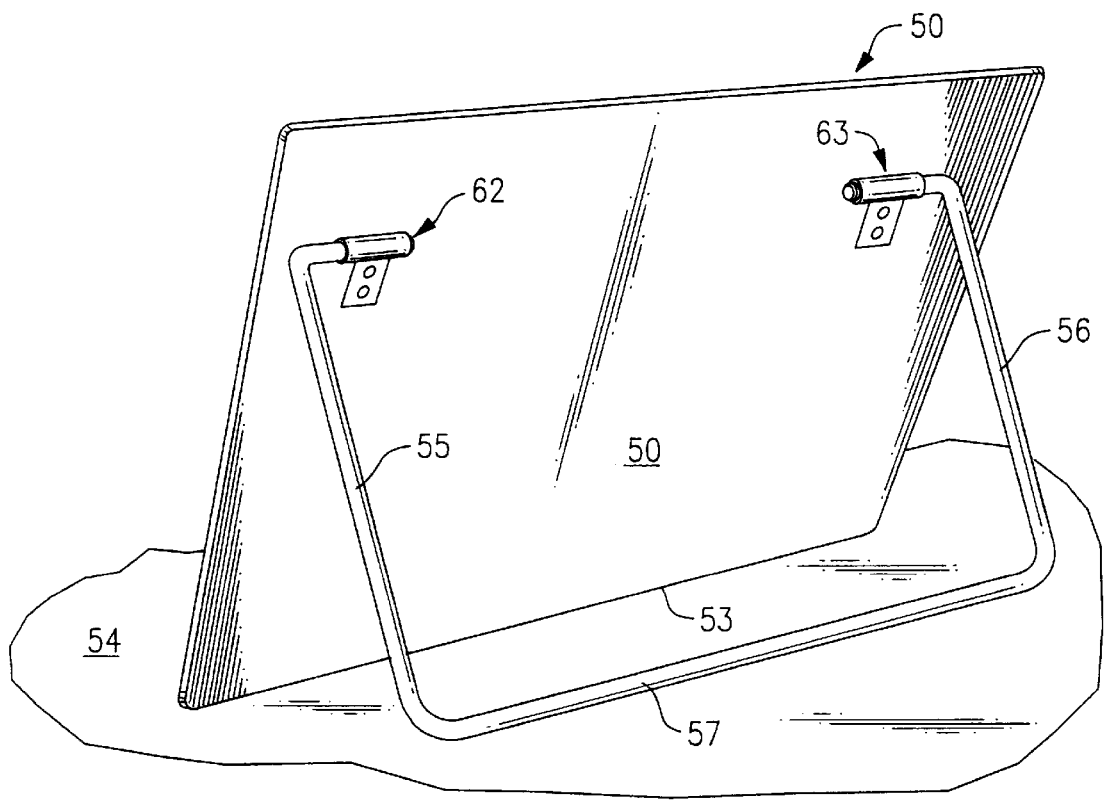
FIG. 5 is a perspective view of the rear face of a photovoltaic module of the invention showing an improved adjustable stand system for the module.

Referring now to FIG. 4, the electrical power output from the module 10 is transmitted to the linear voltage regulator 21 which supplies a substantially constant volt direct-current output of approximately 5 or 6 volts. As shown by the dot-dash lines, this voltage output is delivered to a conventional sample and hold circuit 26 associated with a timer 27, to a window comparator 28 and to the liquid crystal display device 22. Relatively low power output from the sun sensor 24 is delivered to the sample and hold circuit 26 where a resistor 30 and an operating amplifier 31 convert current output to a voltage signal. The timer 27 may be selectively adjusted to determine the frequency and duration of the voltage signal from the sample and hold circuit 26 to be delivered to the window comparator 28. The window comparator 28 includes individual comparators 33 and 34 and a logical nor 35 functioning in a known manner to indicate the direction of change of the voltage signal from the sample and hold circuit 26. If the change of that signal is increasing, a positive direction of change arrow 37 on the display device 22 becomes visible. If the change of that signal is decreasing a negative direction of change arrow 38 on the display device 22 becomes visible. If the signal is constant and not changing then a center bar 39 on the display 22 becomes visible. The voltage signal from the sample and hold circuit 26 is also transmitted by a conductor 40 to a digital informational display 41 where its level of intensity is indicated by digits ranging, for example, from 000 to 999. This quantifies the power output effectiveness of the module 10 for its instantaneous orientation with respect to the source of sunlight.

In operation the module 10 is oriented by hand with respect to an energizing light source such as the sun. If the incidence of energizing light, or insolation, falls generally perpendicular to the module 10, the sun sensor 24 will produce a maximum signal for that intensity of sunlight and a corresponding reading will be visible on the digital display 41. If the module is oriented by hand to a position where the incident sunlight is not falling generally perpendicularly upon it, the signal from the sun sensor 24 will be reduced and a lesser number will appear in the digital display 41. In moving from the maximum to the lesser output the negative direction of change arrow 38 will be visible. As the operator moves the module 10 back toward the orientation of maximum power output, the numbers visible in the digital display 41 will increase and the positive change arrow 37 will be visible. With the module 10 held stationary the center bar 29 of the display 39 will be visible.

By taking into account this read-out information the operator will be able to locate the optimum position of the module 10 with respect to the energizing sunlight. As the intensity of the sunlight itself increases or decreases while the module 10 remains stationary, the read-out information on the arrows 37 and 38 and on display 41 will vary accordingly. This can be useful to the operator to know how the power output effectiveness of the module 10 is varying by the climatic changes or motion of the sun through the sky affecting the intensity of the sunlight.

Turning now to FIGS. 5 to 8, a form of the invention is shown which provides an adjustable stand system for the module. Specifically, an improved photovoltaic module 50 is provided with a planar array of photovoltaic cells 51 and an electrically actuated display assembly 52 on its front face. The display assembly 52 may be of the form described previously with reference to the assembly 20. As noted, the display assembly 52 indicates the power generating effectiveness of the module 50 for its instantaneous orientation with respect to an energizing light source. In this embodiment a stand system for the module 50 is provided which holds the module 50 at its optimum orientation with respect to the light source.

This stand system includes a straight lower mounting edge 53 on the module 50 for disposition on a typically horizontal support surface 54. The system also includes a support member which consists of two parallel side sections 55 and 56 joined at one end by an extended support arm 57 parallel to the straight mounting edge 53 on the module 50. Each of the side sections 55 and 56 and the connecting support arm 57 are of the same circular cross section.

Figure 6:
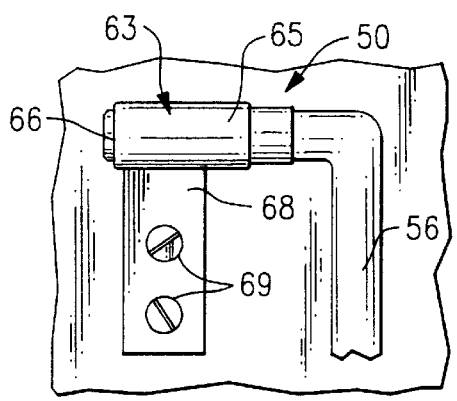
FIG. 6 is an enlarged fragmentary view of a hinge element for the stand system of the module.
Figure 7:
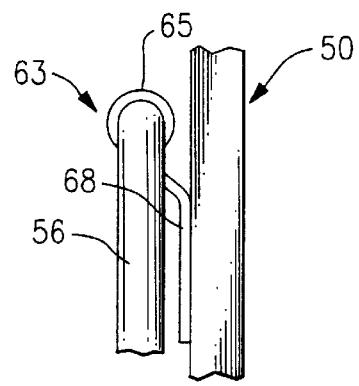
FIG. 7 is an enlarged fragmentary end view of the hinge element of FIG. 6.

Left and right hinge elements 62 and 63 are provided on the rear face of the module 50 opposite the face on which the photovoltaic cells 51 are located. FIGS. 6 and 7 illustrate in detail the forms of the right hinge element 63. It is to be understood that the left hinge element 62 is of the same form but a mirror image of the right hinge element 63. The hinge element 63 includes a conventional infinitely adjustable cylindrical spring clutch 65 within which is fitted an end portion 66 of the side section 56 which is part of but at a right angle to the remainder of the side section 56 of the stand. Fixedly extending from the spring clutch 65 is a support bracket 68 adapted to receive a pair of screws 69 which fix the bracket 68 and the clutch 65 to the rear of the module 50. A form of the spring clutch 65 particularly suitable to this invention is manufactured by General Clutch Corp. of Stanford, Conn., under the designation TorqMaster Hinge.

In the operation of the stand system shown in FIGS. 5 to 8, the hinge elements 62 and 63 permit infinite adjustment of the angle between the front face of the module 50 on which the photovoltaic cells 51 are located and the support surface 54 so that the module front face can be oriented substantially perpendicular to light rays from the energizing light source. Because of the infinitely adjustable form of the hinge units 62 and 63, the planar array of photovoltaic cells 51 may be disposed at the optimum angle with respect to the horizontal support surface 60 to maximize the power output of the cells 51.

The highest efficiency of power output from the photovoltaic cells 51 is achieved when the front face of the module 50 is disposed within about five degrees perpendicular to the light rays striking the photovoltaic cells 51. As noted previously, the effectiveness of this power output is indicated on the electrically activated display assembly 52. If the output of the cells 51 varies measurably from the optimum, appropriate adjustment can easily be made of the angle of the stand system to the front face of the module 50.

Figure 8:
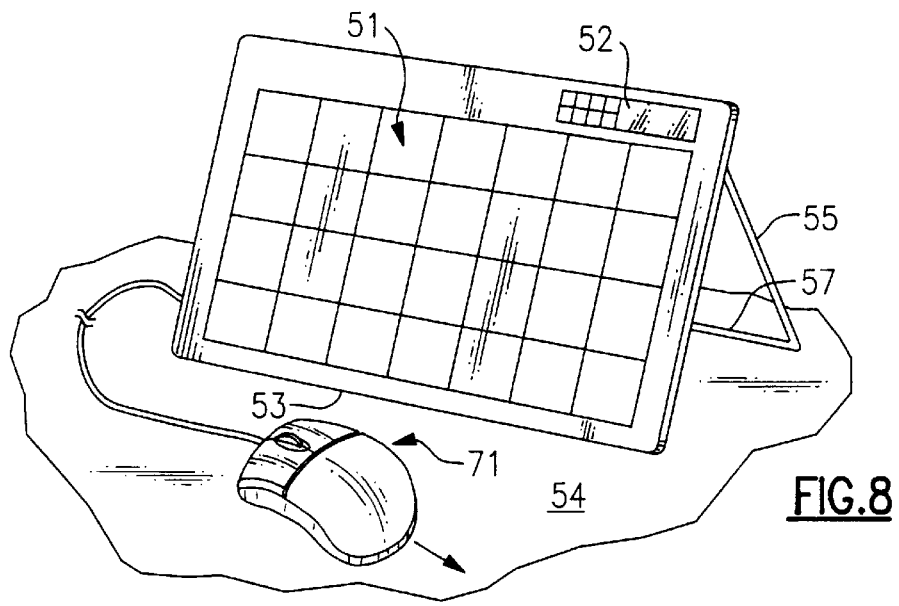
FIG. 8 is a perspective view of a photovoltaic module of the invention illustrating a multi-volt controller for regulating power between the photovoltaic module and an associated electrically driven device.
Figure 9:
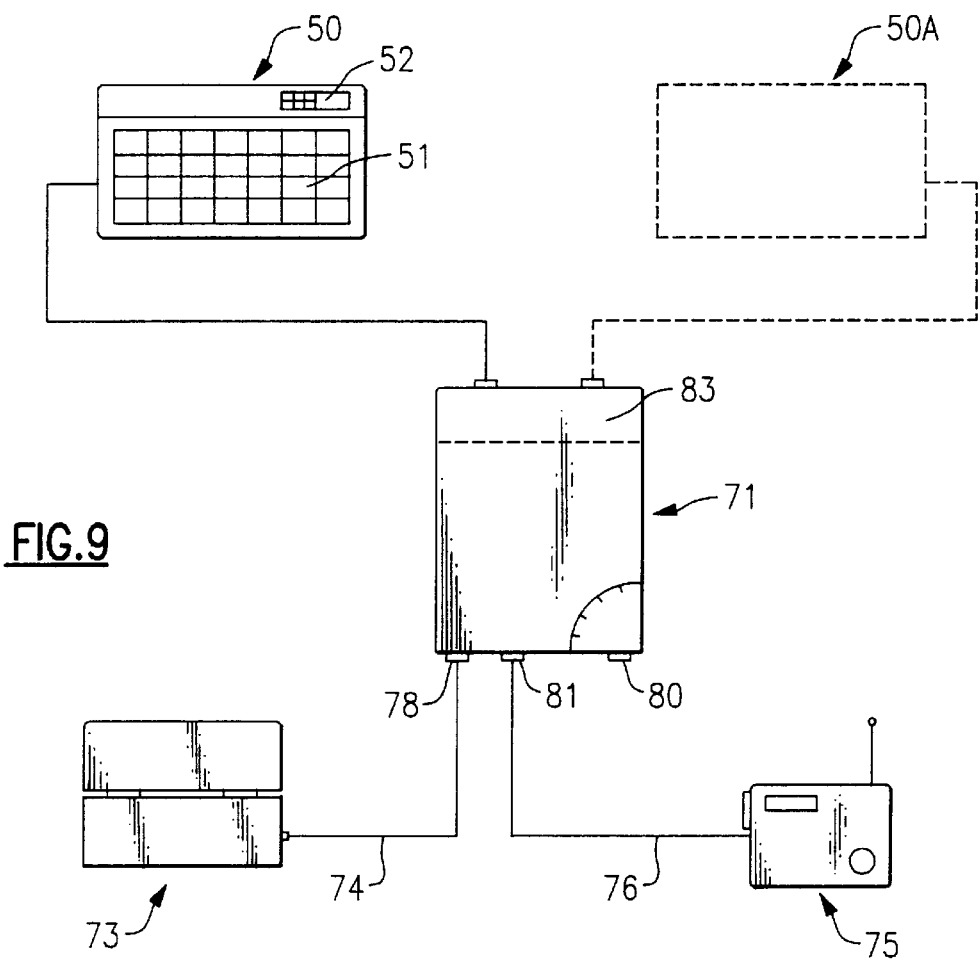
FIG. 9 is a schematic illustration of the multi-volt controller of the invention associated with at least one photovoltaic module and one or more driven electric devices.

FIGS. 8 and 9 illustrate another feature of the invention and that is a multi-volt controller system. Again, the improved module 50 is included with its array of photovoltaic cells 51 and display assembly 52, all as described previously. The stand system disclosed above is also preferred to be in combination with the multi-volt controller system.

The electrical output from the module 50 is transmitted by a conductor 70 to a multi-volt controller 71 which includes two voltage regulators. One voltage regulator provides power for a laptop computer 73 through an output conductor 74. The other regulator provides power for a unit such as a portable stereo 75 through an output conductor 76. A constant voltage is required for the computer 73, such as 18 volts, and therefore a constant voltage in that amount is maintained at an output terminal 78 to which the conductor 74 and the laptop computer 73 are connected. For the other powered electronic device, such as the stereo 75, the voltage may be variable. A voltage selector switch 80 on the controller 71 can be operated to vary the voltage at an output terminal 81 from say 3 volts to 6, 7.5, 9 or 12 volts.

Within the multi-volt controller 71 is a maximum power tracker 83. The optimum operating voltage for the module 50 under all sunlight conditions may be for example a minimum of 6.4 volts and a maximum of 6.9 volts. This range of output volts from the module 50 is monitored by the tracker 83. If the voltage from the module 50 drops below 6.4 volts the tracker 83 disconnects the power output at the terminals 78 and 81. The voltage of the module 50 then rises until it reaches 6.9 volts, at which time the tracker automatically reconnects the power output at the terminals 78 and 81.

It will be understood that this disconnecting and reconnecting of the terminals 78 and 81 only occurs if the power required by the load, such as the computer 73 and the stereo 75, exceeds the power available from the module 50. If the power required for this load can be supplied by the module 50, the tracker 83 continues to monitor the output of the module 50 but does not disconnect the load such as the computer 73 and the stereo 75.

A second photovoltaic module 50A may be associated with the multi-volt controller 71 as shown in dotted lines in FIG. 9, thus doubling the output of the system. The system then would deliver sufficient power to operate the laptop computer 73 and the stereo 75 while still trickle-charging batteries which may be associated with the computer 73 and the stereo 75.

The purpose of the combination of the multi-volt controller 71 and the maximum power tracker 83 is to transfer energy from the photovoltaic module 50 to the load regardless of the size of the load. When the available energy from the module 50 exceeds the load requirements, output of the multi-volt controller 71 is a DC voltage fixed by the multi-volt controller 71. The maximum power tracker 83 then simply monitors the output voltage of the module 50.

When the available energy from the module 50 is less than required by the load, output from the multi-volt controller 71 is a pulsed DC voltage, the width of the pulse varying inversely with the load and module output. The maximum power tracker 83 monitors and maintains the output of the module 50 between selected voltages such as the 6.4 volt minimum and the 6.9 volt maximum mentioned previously. This is done by disconnecting and reconnecting the output of the multi-volt controller 71 from the load. As noted, the load may be disconnected when the module voltage drops to 6.4 volts and reconnected when the module voltage is 6.9 volts. As a result maximum energy is transferred from the photovoltaic module to the load.

The scope of the invention is to be determined from the following claims rather than from the foregoing description of preferred embodiments.

What is claimed is:

1. In combination with a substantially flat photovoltaic module having photovoltaic cells on one face thereof wherein an electrically activated display device on the module indicates its power generating effectiveness for its instantaneous orientation with respect to an energizing light source, the improvement which comprises
   a) a stand system for locating said module at its optimum orientation with respect to said light source comprising
      i. a straight mounting edge on said module for disposition on a support surface,
      ii. at least one infinitely adjustable hinge element on that face of said module opposite the module face on which the photovoltaic cells are located,
      iii. a support member pivotally attached to said module by said hinge element and including an extended support arm remote from the hinge element disposed parallel to said mounting edge of the module,
      iv. the hinge element permitting infinite adjustment of the angle between the module face on which the photovoltaic cells are located and the support surface so that the module may be oriented substantially perpendicular to light rays from the energizing light source; and
   b) a multi-volt controller electrically connected between said module and a load powered by the module comprising
      i. at least one voltage regulator for maintaining the photovoltaic module output voltage at some predetermined level consistent with said load, and
      ii. a maximum power tracker for monitoring the power output of the module so as to disconnect the module from the load when its voltage output drops below a certain minimum and to reconnect the module to that load when its voltage output rises above a certain maximum which is higher than said minimum,
      iii. the maximum power tracker having no effect if the load can be powered by the module.

2. In combination with a substantially flat photovoltaic module having photovoltaic cells on one face thereof wherein an electrically activated display assembly on the module indicates its power generating effectiveness for its instantaneous orientation with respect to an energizing light source, a stand system for locating said module at its optimum orientation with respect to said light source comprising
   a) a straight mounting edge on said module for disposition on a support surface,
   b) at least one infinitely adjustable hinge element on that face of said module opposite the module face on which the photovoltaic cells are located,
   c) a support member pivotally attached to said module by said hinge element and including an extended support arm remote from the hinge element disposed parallel to said mounting edge of the module, d) the hinge element permitting infinite adjustment of the angle between the module face on which the photovoltaic cells are located and the support surface so that the module may be oriented substantially perpendicular to light rays from the energizing light source.

3. The combination according to claim 2 wherein two hinge elements are included in the stand system.

4. The combination of claim 3 wherein the two hinge elements are of the same form except that each is a mirror image of the other.

5. The combination of claim 3 wherein the support member includes two parallel side sections extending from the respective hinge elements to respective opposite ends of the support arm.

6. The combination of claim 5 wherein the parallel sides and support arm of the support member are all continuous and of the same circular cross section.

7. In combination with a substantially flat photovoltaic module having photovoltaic cells on one face thereof wherein an electrically activated display assembly on the module indicates its power generating effectiveness for its instantaneous orientation with respect to an energizing light source, a multi-volt controller electrically connected between said module and a load powered by the module comprising a) at least one voltage regulator for maintaining the photovoltaic module output voltage at some predetermined level consistent with said load, and b) a maximum power tracker for monitoring the voltage output of the module so as to disconnect the voltage regulator from the load when the module voltage output drops below a certain minimum and reconnect the voltage regulator to that load when the module voltage output rises above a certain maximum which is higher than said minimum, c) the maximum power tracker having no effect if the load can be powered by the module.

8. The combination according to claim 7 wherein two voltage regulators are provided one for maintaining the first voltage regulator output at fixed voltage to power a computer and the other for maintaining the second voltage regulator output at a selected voltage to power apparatus requiring that selected voltage.

* * * * *